(12) United States Patent
Mori

(10) Patent No.: US 10,306,390 B2
(45) Date of Patent: May 28, 2019

(54) AUDIO PROCESSING APPARATUS FOR PROCESSING AUDIO AND AUDIO PROCESSING METHOD

(71) Applicant: CANON KABUSHIKI KAISHA, Tokyo (JP)

(72) Inventor: Hiroyuki Mori, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/978,719

(22) Filed: May 14, 2018

(65) Prior Publication Data

US 2018/0338211 A1 Nov. 22, 2018

(30) Foreign Application Priority Data

May 19, 2017 (JP) .................................. 2017-099659

(51) Int. Cl.
| | |
|---|---|
| H04R 29/00 | (2006.01) |
| H03G 3/20 | (2006.01) |
| H04N 5/77 | (2006.01) |
| H04N 9/802 | (2006.01) |
| H04R 3/00 | (2006.01) |
| H04N 5/60 | (2006.01) |
| H03G 3/30 | (2006.01) |

(52) U.S. Cl.
CPC ............. H04R 29/004 (2013.01); H03G 3/20 (2013.01); H04N 5/772 (2013.01); H04N 9/802 (2013.01); H03G 3/3005 (2013.01); H04N 5/602 (2013.01)

(58) Field of Classification Search
CPC ...... H04R 29/004; H03G 3/20; H03G 3/3005; H03G 3/24; H04N 5/772; H04N 9/802; H04N 5/602; G10L 13/00
USPC ..................... 381/58, 92, 104–109
See application file for complete search history.

(56) References Cited

U.S. PATENT DOCUMENTS

| | | | |
|---|---|---|---|
| 2008/0219470 A1 | 9/2008 | Kimijima | |
| 2010/0027810 A1* | 2/2010 | Marton | G10L 21/0208 381/94.1 |
| 2014/0185833 A1* | 7/2014 | Ikeda | H03G 3/301 381/107 |

FOREIGN PATENT DOCUMENTS

JP    9-148950 A    6/1997

* cited by examiner

*Primary Examiner* — Xu Mei
*Assistant Examiner* — Ammar T Hamid
(74) *Attorney, Agent, or Firm* — Canon U.S.A., Inc. IP Division

(57) ABSTRACT

A level detection unit detects a level of an audio signal. A level control unit controls the level of the audio signal according to a gain. A gain control unit performs a limit operation and a recovery operation according to the level of the audio signal. A noise generation unit outputs a noise signal. A combination unit combines the audio signal from the level control unit with the noise signal. In a second recovery mode, the gain control unit increases the gain in a longer time than in a first recovery mode. The gain control unit controls the noise generation unit to output a noise signal with a predetermined level in the first recovery mode, and to output a noise signal with a level according to the gain of the level control unit in the second recovery mode.

18 Claims, 5 Drawing Sheets

AUDIO PROCESSING APPARATUS FOR PROCESSING AUDIO AND AUDIO PROCESSING METHOD

BACKGROUND

Technical Field

The present disclosure relates to an audio processing apparatus for processing audio and an audio processing method.

Description of the Related Art

A video camera is conventionally known as an audio processing apparatus. A video camera has a function of recording audio with a suitable level. More specifically, the video camera controls the gain to prevent the level of input audio from exceeding a threshold value (limit operation) and, if the level of the input audio decreases, the video camera increases the gain (recovery operation). In addition, if a time period during which the input audio level exceeds the threshold value is short, the video camera quickly increases the gain in the recovery operation to reduce audio fluctuations. As a technique similar to the recovery operation, Japanese Patent Application Laid-Open No. 9-148950 discusses a technique for reducing strangeness in listening due to a sudden stop of audio output by applying noise to an audio signal. In this case, the level of noise increases as the receiving intensity of a digital broadcasting wave decreases.

When clapping sound occurs near a video camera under a comparatively quiet environment, such as a concert hall, the above-described limit operation and recovery operation will be repeated at comparatively short intervals. Meanwhile, input audio includes noise determined by the performance of a sound collection apparatus such as a microphone. Therefore, when the above-described limit operation and recovery operation are repeated at comparatively short intervals, the level of this noise will similarly fluctuate. In particular, in a case of audio recorded in a quiet environment, level fluctuations of the noise will be very easily perceived by a user, and as a result, the user has a feeling of strangeness about the recorded audio.

SUMMARY

An audio processing apparatus includes a detection unit configured to detect a level of an input audio signal, a level control unit configured to control the level of the audio signal according to a gain, a gain control unit configured to, in a case where the detected level exceeds a threshold level, perform a limit operation for decreasing the gain so that the level of the audio signal to be output from the level control unit becomes equal to or lower than the threshold level, and, in a case where the level becomes not higher than the threshold level during execution of the limit operation, perform a recovery operation for increasing the gain, a noise generation unit configured to output a noise signal, and a combination unit configured to combine the audio signal output from the level control unit with the noise signal output from the noise generation unit. The gain control unit includes a first recovery mode and a second recovery mode as the recovery operation. In the second recovery mode, the gain control unit increases the gain in a longer time than in the first recovery mode. The gain control unit controls the noise generation unit to output the noise signal with a predetermined level in the first recovery mode, and to output the noise signal with a level according to the gain of the level control unit in the second recovery mode.

Further features of the present disclosure will become apparent from the following description of exemplary embodiments with reference to the attached drawings.

DESCRIPTION OF THE EMBODIMENTS

One or more aspects of the present disclosure will be described below with reference to the accompanying drawings.

Figure 1:
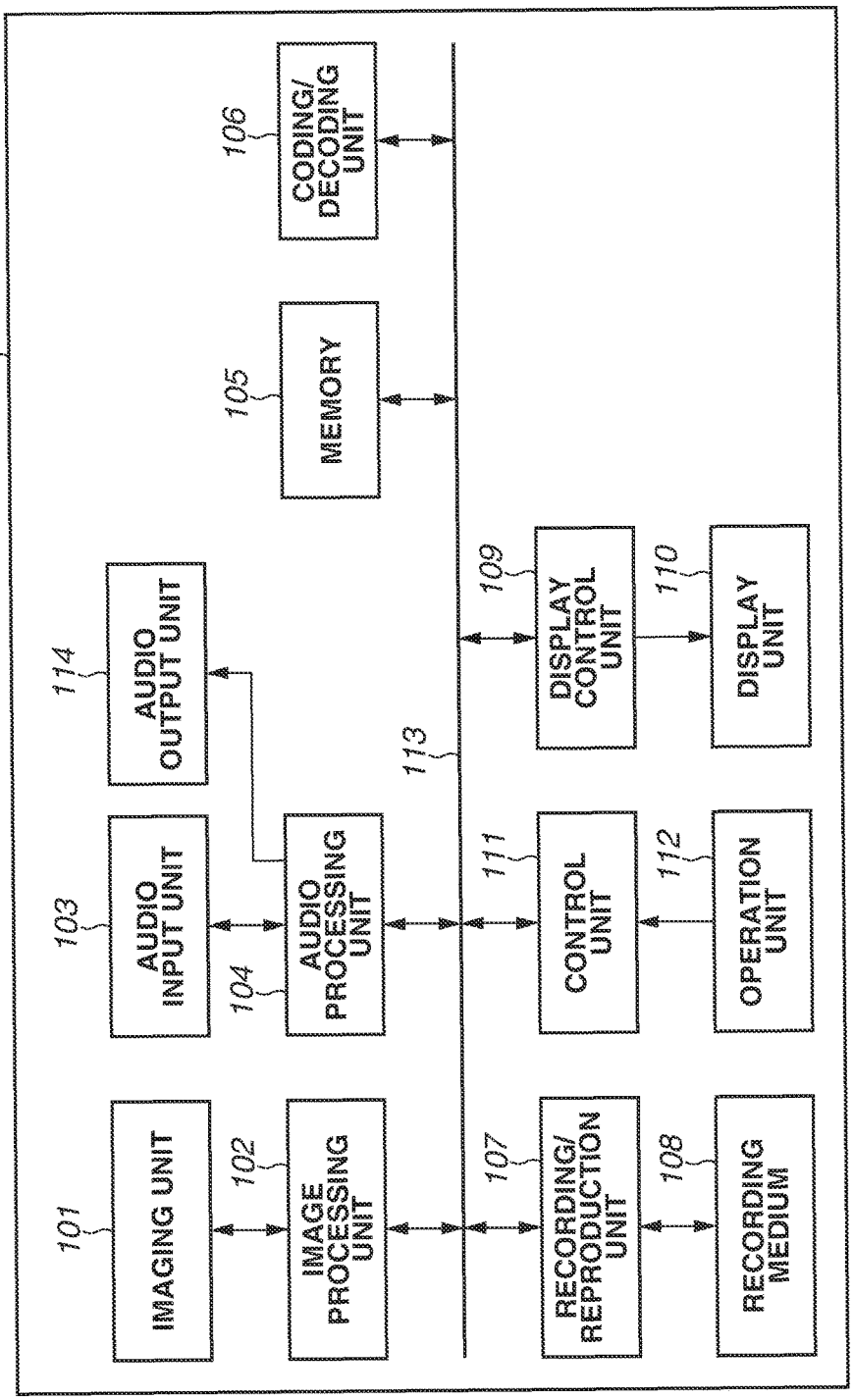
FIG. 1 is a block diagram illustrating an overall configuration of an imaging apparatus according to one or more aspects of the present disclosure.

FIG. 1 is a block diagram illustrating an overall configuration of an imaging apparatus 100 as an example application of an audio processing apparatus according to the present exemplary embodiment. The imaging apparatus 100 according to the present exemplary embodiment is capable of capturing and recording moving images and still images and also acquiring and recording sounds at the time of capturing images.

An imaging unit 101 includes an imaging lens and an image sensor. When a moving image is to be captured, for example, the imaging unit 101 performs photoelectric conversion on an optical image, such as a subject image, to acquire an analog image signal, converts the analog image signal into a digital image signal through analog-to-digital conversion, and outputs the digital image signal to an image processing unit 102. The image processing unit 102 performs various processing, such as known development processing and white balance adjustment, on the image signal output from the imaging unit 101, and outputs the processed signal to a bus 113.

An audio input unit 103 includes a microphone (hereinafter referred to as a microphone 201 described below) illustrated in FIG. 2 built in the imaging apparatus 100. When a moving image is to be captured, for example, the audio input unit 103 acquires sound around the imaging apparatus 100 and outputs the acquired sound to an audio processing unit 104. An audio input unit 103 including an external audio input terminal is capable of acquiring an audio signal supplied from an external microphone connected via the external audio input terminal, and outputting the audio signal to the audio processing unit 104. The audio processing unit 104 converts the analog audio signal supplied from the audio input unit 103 into a digital audio signal, performs processing related to directivity, processing for normalizing the audio level, processing for reducing specific frequencies, and other audio processing, and outputs the processed audio signal to the bus 113.

A memory 105 temporarily stores the image signal output from the image processing unit 102, the audio signal output from the audio processing unit 104, and a compressed image and the compressed audio signal generated through coding (described below). The bus 113 transmits various signals (image signals, audio signals, compressed image signals, and compressed audio signals) and control signals between units. Although, in the present exemplary embodiment, signal transmission is performed via the bus 113, a description thereof will be omitted in the following descriptions.

When a moving image is to be captured, a coding/decoding unit 106 reads the image signal temporarily stored in the memory 105 and codes the image signal to generate a compressed image signal, and similarly reads the audio signal from the memory 105 and codes the audio signal to generate a compressed audio signal. The compressed image signal and the compressed audio signal are transmitted to a recording/reproduction unit 107.

When a moving image is to be captured, the recording/reproduction unit 107 records the compressed image signal and the compressed audio signal generated by the coding/decoding unit 106 and other necessary data to a recording medium 108. The recording medium 108 is a random access recording medium such as a memory card. The recording medium 108 may be a magnetic disk, optical disk, semiconductor memory, and recording media of any other types, and may be a single medium or a plurality of recording media.

When a moving image is to be reproduced, the recording/reproduction unit 107 reads the compressed image signal and the compressed audio signal recorded in the recording medium 108 and transmits the signals to the coding/decoding unit 106. When a moving image is to be reproduced, the coding/decoding unit 106 decodes the compressed image signal and the compressed audio signal. Then, the decoded image signal is transmitted to a display control unit 109, and the decoded audio signal is transmitted to the audio processing unit 104.

When a moving image is to be captured, the display control unit 109 displays on a display unit 110 the moving image captured by the imaging unit 101 and processed by the image processing unit 102 and various information required to operate the imaging apparatus 100. The display unit 110 includes a display device such as a liquid crystal display (LCD), organic electroluminescence (EL) display, and electronic paper. When a moving image is to be reproduced, the display control unit 109 displays on the display unit 110 the moving image reproduced and decoded from the recording medium 108.

When a moving image is to be reproduced, the audio signal reproduced and decoded from the recording medium 108 is transmitted to the audio processing unit 104. When a moving image is to be reproduced, the audio processing unit 104 outputs to an audio output unit 114 the audio signal reproduced and decoded from the recording medium 108. The audio output unit 114 converts the digital audio signal supplied from the audio processing unit 104 into an analog audio signal as required and outputs the analog audio signal to an external audio monitor.

An operation unit 112 transmits an instruction signal corresponding to an operation of a user to a control unit 111. The operation unit 112 includes a power button, recording start/end button, reproduction button, menu display button, determination button, cursor key, mode change switch, dial, pointing device for specifying an arbitrary point on the display unit 110, and touch panel.

The control unit 111 controls each unit of the imaging apparatus 100 based on an instruction signal transmitted from the operation unit 112. The control unit 111 includes a central processing unit (CPU) (micro processing unit (MPU)) for executing various processing, and memories (including a dynamic random access memory (DRAM), static random access memory (SRAM), and read only memory (ROM)). The ROM of the control unit 111 stores programs for various control and processing according to the present exemplary embodiment to be executed by the CPU, and various initial setting values.

Normal operations of the imaging apparatus 100 will be described below.

When the user performs a power-ON operation on the power button of the operation unit 112, the operation unit 112 issues an activation instruction to the control unit 111. Upon reception of the activation instruction, the control unit 111 controls a power supply unit (not illustrated) to supply power to each unit of the imaging apparatus 100. When power is supplied, based on the instruction signal from the operation unit 112, the control unit 111 determines, for example, which of the imaging and reproduction modes the user has selected by operating the mode change switch of the operation unit 112. For example, when the user has selected the imaging mode, the control unit 111 shifts the imaging apparatus 100 to the imaging standby state. In the imaging standby mode, when the user operates the recording start button of the operation unit 112, the control unit 111 controls each unit to start the imaging and recording operations. During execution of imaging in the imaging mode, the compressed image signal generated from the captured image signal and the compressed audio signal generated from the input audio signal at the time of capturing an image are recorded in the recording medium 108. Then, when the user operates the recording end button of the operation unit 112, the control unit 111 controls each unit to end the imaging and recording operations and returns the imaging apparatus 100 to the imaging standby state. When the reproduction mode is entered, the control unit 111 instructs the recording/reproduction unit 107 to read the compressed image signal and the compressed audio signal from the recording medium 108, and transmits the compressed signals to the coding/decoding unit 106. The coding/decoding unit 106 decodes the compressed image signal and the compressed audio signal. The decoded moving image is displayed on the display unit 110 via the display control unit 109, and the decoded audio is output from the audio output unit 114 via the audio processing unit 104.

Operations of the imaging apparatus 100 in the imaging mode will be described in detail below.

When the imaging mode is entered, the control unit 111 first sets the imaging apparatus 100 to the imaging standby state, as described above. In the imaging standby state, the user operates the recording start button of the operation unit 112. Then, upon input of an imaging/recording start instruction signal, the control unit 111 transmits a recording start control signal to each unit of the imaging apparatus 100 to control each unit to perform the following imaging operations.

Upon reception of the recording start control signal from the control unit 111 via the image processing unit 102, the imaging unit 101 converts, via an image sensor, an optical image, such as a subject image captured by the imaging lens, into an analog image signal. The imaging unit 101 further converts the analog image signal into a digital image signal through analog-to-digital conversion, and outputs the digital signal to the image processing unit 102. At this timing, the image processing unit 102 performs image quality adjustment processing on the image signal output from the imaging unit 101. More specifically, for example, based on setting values for white balance adjustment, color adjustment, and brightness adjustment controlled by the control unit 111, the image processing unit 102 performs the image quality adjustment processing on the image signal. The image signal processed by the image processing unit 102 is transmitted to the display control unit 109. The display control unit 109 displays on the display unit 110 a video image based on the image signal received from the image processing unit 102. The image signal processed by the image processing unit 102 is also transmitted to the memory 105 to be temporarily stored therein.

Upon reception of the recording start control signal from the control unit 111 via the audio processing unit 104, the audio input unit 103 acquires the analog audio signal from the built-in microphone or an external microphone connected via the external audio input terminal. The audio input unit 103 further converts the analog audio signal into a digital audio signal through analog-to-digital conversion, and then transmits the digital audio signal to the audio processing unit 104. The audio processing unit 104 selects as required the audio signal acquired via the built-in microphone or the external audio input terminal, and performs processing for normalizing the audio level, and processing for reducing specific frequencies on the audio signal. The audio signal processed by the audio processing unit 104 is transmitted to the memory 105 to be temporarily stored therein.

In the imaging mode, upon reception of the recording start control signal from the control unit 111, the coding/decoding unit 106 reads the image signal and the audio signal temporarily stored in the memory 105, and performs predetermined coding processing on the image signal and the audio signal to generate a compressed image signal and a compressed audio signal. Then, the control unit 111 forms a data stream including the compressed image signal and the compressed audio signal, and outputs the data stream to the recording/reproduction unit 107. Upon reception of the recording start control signal from the control unit 111, the recording/reproduction unit 107 stores the data stream as one moving image file under management of a file system such as the Universal Disk Format (UDF) and File Allocation Table (FAT). Then, the recording/reproduction unit 107 records the moving image file in the recording medium 108. The control unit 111 controls each unit to continue the above-described operations while imaging is in progress in the imaging mode.

Subsequently, the user operates the recording start and end button of the operation unit 112. Then, upon reception of an imaging/recording end instruction signal, the control unit 111 transmits a processing end control signal to each unit of the imaging apparatus 100 to control each unit to perform the following imaging end operations.

Upon reception of the processing end control signal from the control unit 111, the image processing unit 102 stops transmitting the above-described processed image signal to the memory 105, and similarly the audio processing unit 104 stops transmitting the above-described processed audio signal to the memory 105.

Upon reception of the processing end control signal from the control unit 111, the coding/decoding unit 106 stops the coding operation. However, if an image signal and an audio signal not having been coded remain in the memory 105 upon reception of the processing end control signal, the coding/decoding unit 106 reads the remaining uncoded image signal and uncoded audio signal and performs the predetermined coding processing on the remaining uncoded signals. Then, upon completion of the coding processing on the remaining uncoded image signal and uncoded audio signal, the coding/decoding unit 106 stops signal reading from the memory 105 and the coding operation.

The control unit 111 forms a data stream including the compressed image signal and the compressed audio signal which have been coded by the coding/decoding unit 106. The recording/reproduction unit 107 records the data stream in the recording medium 108. When the data stream supply from the control unit 111 stops, the recording/reproduction unit 107 completes a moving image file and stops the recording operation. Then, when the recording/reproduction unit 107 stops the recording operation, the control unit 111 transmits to each unit a control signal for shifting the imaging apparatus 100 to the imaging standby state. In this manner, the imaging apparatus 100 enters the imaging standby state.

When the imaging apparatus 100 is in the imaging standby state, the control unit 111 controls each unit of the imaging apparatus 100 to operate as follows.

When the imaging apparatus 100 is in the imaging standby state, the image signal captured by the imaging unit 101 and processed by the image processing unit 102 is transmitted to the display control unit 109. The display control unit 109 displays on the display unit 110 a video image related to the image signal supplied from the image processing unit 102 in the imaging standby state and information required for operations of the imaging apparatus 100. This allows the user who is operating the imaging apparatus 100 to perform imaging preparation while monitoring the screen displayed on the display unit 110.

Operations of the imaging apparatus 100 in the reproduction mode will be described in detail below.

When the imaging apparatus 100 is in the reproduction mode, the user operates the reproduction button of the operation unit 112. Then, upon input of a reproduction start instruction signal, the control unit 111 transmits the reproduction start control signal to each unit of the imaging apparatus 100 to control each unit to perform the following reproduction operations. It is assumed that, before starting reproduction, the user has specified a file to be reproduced from the moving image files recorded in the recording medium 108.

Upon reception of the reproduction start control signal from the control unit 111, the recording/reproduction unit 107 reads from the recording medium 108 the compressed image signal and the compressed audio signal of the moving image file specified to be reproduced by the user, and temporarily stores the signals in the memory 105. The coding/decoding unit 106 reads the compressed image signal and the compressed audio signal temporarily stored in the memory 105, performs predetermined decoding processing on the signals, and transmits the decoded image signal to the display control unit 109 and transmits the decoded audio signal to the audio processing unit 104.

The display control unit 109 displays on the display unit 110 a video image related to the image signal supplied from the coding/decoding unit 106. The audio processing unit 104 performs digital-to-analog conversion on the digital audio signal supplied from the coding/decoding unit 106 and outputs the audio signal from the audio output unit 114. In the reproduction mode, the imaging apparatus 100 performs video display and audio output for the moving image file read from the recording medium 108 in this way.

The configuration and processing of the audio processing unit 104 according to the first exemplary embodiment will be described in detail below.

Figure 2:
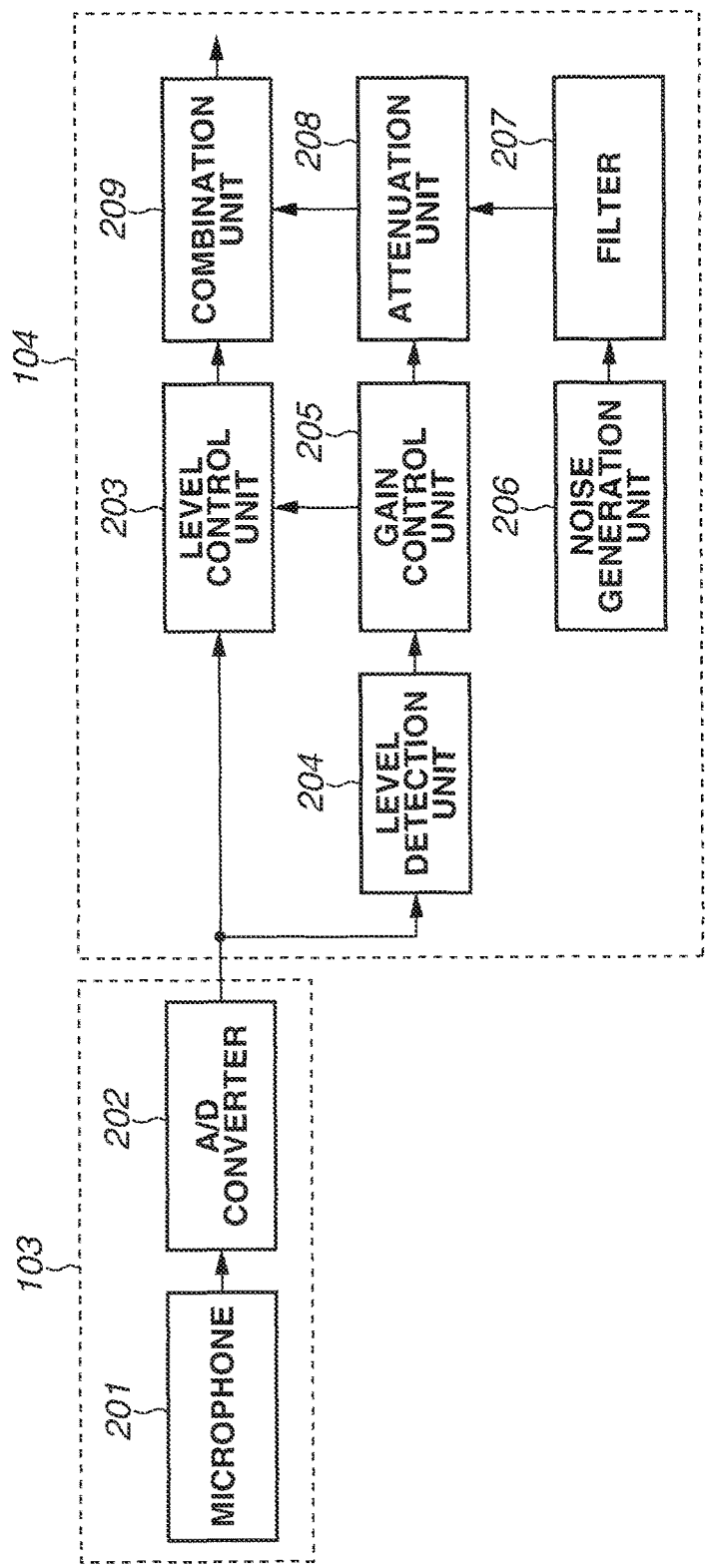
FIG. 2 is a block diagram illustrating configurations of an audio processing unit and an audio input unit according to one or more aspects of the present disclosure.

FIG. 2 is a block diagram illustrating an example configuration of the first exemplary embodiment, more specifically, configurations of the audio input unit 103 and the audio processing unit 104 illustrated in FIG. 1. The configuration of the audio processing unit 104 will be described below centering on components for processing an input audio signal from the audio input unit 103.

Referring to FIG. 2, the audio input unit 103 includes the microphone 201 and an analog-to-digital (A/D) converter 202. An analog audio signal acquired by the microphone 201 is converted into a digital audio signal by the A/D converter 202 and then is transmitted to the audio processing unit 104.

The audio processing unit 104 includes a level control unit 203, a level detection unit 204, a gain control unit 205, a noise generation unit 206, a filter 207, an attenuation unit 208, and a combination unit 209. The input audio signal transmitted from the audio input unit 103 is input to the level control unit 203 and the level detection unit 204.

The level detection unit 204 detects an audio level from the input audio signal and outputs data of the detected audio level to the gain control unit 205. The gain control unit 205 determines a gain value according to the audio level detected by the level detection unit 204 and transmits the determined gain value to the level control unit 203. The level control unit 203 controls the input audio level by using the gain value supplied from the gain control unit 205 and outputs the level to the combination unit 209. The gain control unit 205 controls the limit operation and the recovery operation based on the input audio level and controls the amount of attenuation in noise level attenuation by the attenuation unit 208 (described below) according to the states of the limit operation and the recovery operation. The limit operation refers to an operation for adjusting (limiting) the gain so that the input audio level does not exceed a predetermined threshold level (restriction). The recovery operation refers to an operation for increasing (recovering) the gain if the input audio level decreases when the limit operation is performed.

The noise generation unit 206 generates a random noise signal and outputs the random noise signal to the filter 207. According to the present exemplary embodiment, the noise generation unit 206 generates a random noise signal including noise with a fixed level, ranging from low frequency to high frequency domains. The filter 207 forms a waveform of the noise signal from the noise generation unit 206 and outputs the waveform to the attenuation unit 208. It is assumed that the component of floor noise included in the audio signal acquired by the microphone 201 is, for example, about −60 dBfs (dB full scale). In this case, the filter 207 performs filter processing on the noise signal generated by the noise generation unit 206 so that the noise signal has similar frequency components to those of the floor noise included in the audio signal acquired by the microphone 201.

The attenuation unit 208 adjusts the level of the noise signal output from the filter 207 based on the amount of attenuation from the gain control unit 205, and outputs the noise signal to the combination unit 209. The combination unit 209 combines the audio signal output from the level control unit 203 with the noise signal output from the attenuation unit 208. The output from the combination unit 209 is recognized as the audio signal processed by the audio processing unit 104.

Processing of the audio processing unit 104 will be described in detail below.

Figure 3:
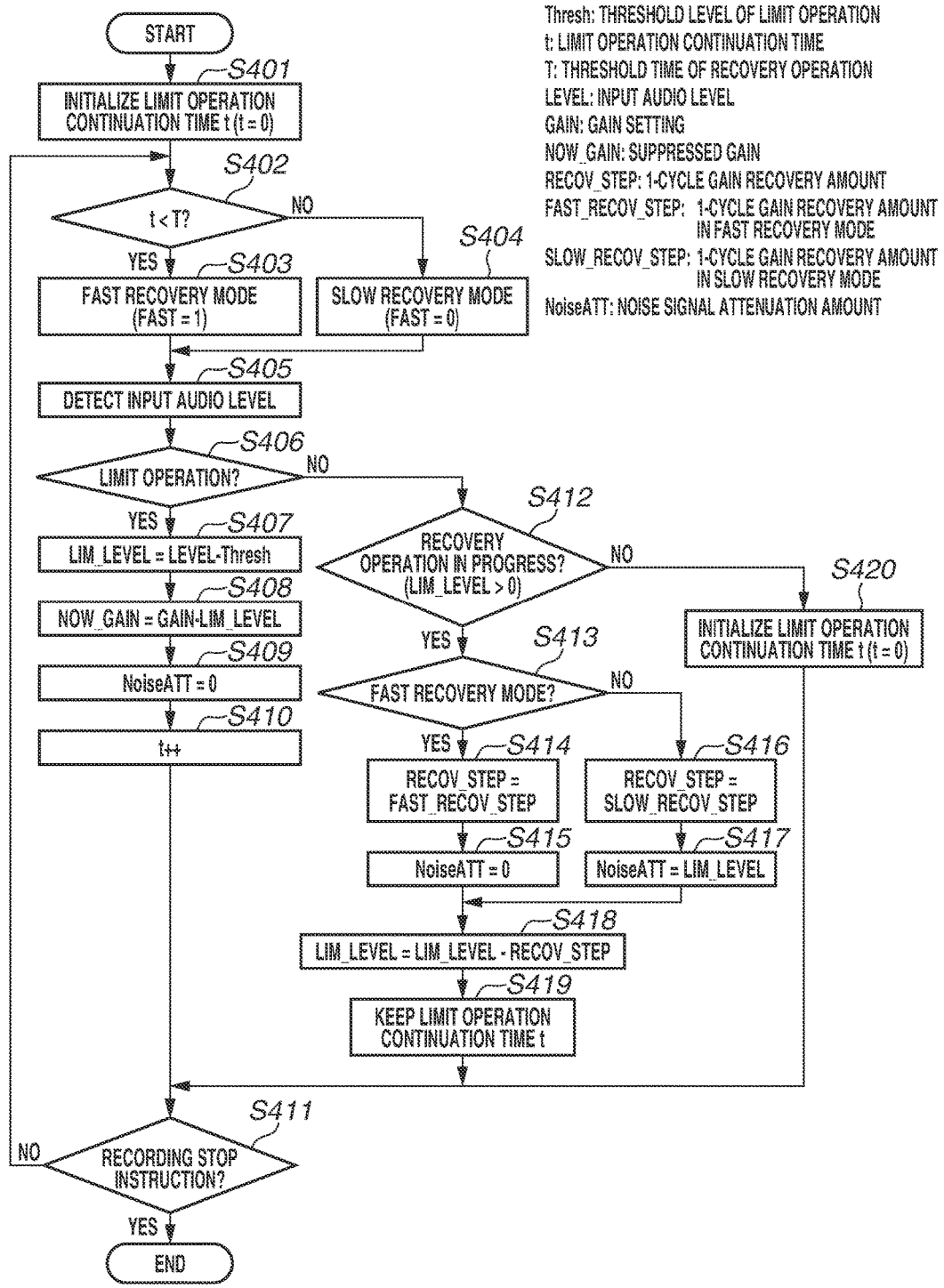
FIG. 3 is a flowchart illustrating audio processing according to one or more aspects of the present disclosure.

FIG. 3 is a flowchart illustrating the processing to be performed by the audio processing unit 104 illustrated in FIG. 2. However, processing in step S411 is performed by the control unit 111. Processing of the flowchart illustrated in FIG. 3 may be implemented by a hardware configuration, or a part of the processing may be implemented by a software configuration and the remaining processing may be implemented by a hardware configuration. When processing is performed by a software configuration, the processing of the flowchart illustrated in FIG. 3 is implemented when the CPU executes an audio processing program according to the present exemplary embodiment. The audio processing program according to the present exemplary embodiment may be prepared in a ROM (not illustrated), read from a detachably attached semiconductor memory (not illustrated), or downloaded from a network (not illustrated) such as the Internet.

The processing of the flowchart illustrated in FIG. 3 is started when a moving image capturing/recording start instruction is input from the user via the operation unit 112, and a recording start control signal is input from the control unit 111 to the audio processing unit 104. The processing from steps S402 to S411 is performed, for example, in each predetermined 1-cycle period. Processing in each cycle is repetitively performed until a moving image recording stop instruction is input from the user via the operation unit 112.

When the moving image recording start instruction is input from the user and the processing of the flowchart illustrated in FIG. 3 starts, then in step S401, the gain control unit 205 initializes a limit operation continuation time t to zero (0).

In step S402, the gain control unit 205 determines whether the limit operation continuation time t in the preceding cycle is shorter than a threshold time T for the determination of the recovery mode. According to the present exemplary embodiment, the gain control unit 205 is able to set two different recovery modes: fast recovery mode and slow recovery mode. The fast recovery mode is a mode in which, after the limit operation is performed, the gain control unit 205 recovers the gain by quickly increasing the gain in a short time. The slow recovery mode is a mode in which, after the limit operation is performed, the gain control unit 205 recovers the gain by gradually increasing the gain in a longer time than in the fast recovery mode. When the gain control unit 205 determines that the continuation time t is shorter than the threshold time T (t<T) (YES in step S402), the processing proceeds to step S403. In step S403, the gain control unit 205 sets the fast recovery mode as the recovery mode. On the other hand, when the gain control unit 205 determines that the continuation time t is equal to or longer than the threshold time T (t≤T) (NO in step S402), the processing proceeds to step S404. In step S404, the gain control unit 205 sets the slow recovery mode as the recovery mode. According to the present exemplary embodiment, when the fast recovery mode is set, the gain control unit 205 set a flag FAST to 1. On the other hand, when the slow recovery mode is set, the gain control unit 205 sets the flag FAST to 0. After steps S403 and S404, the processing of the audio processing unit 104 proceeds to step S405 to be performed by the level detection unit 204.

In step S405, the level detection unit 204 detects the input audio level and outputs data of the audio level to the gain control unit 205. After step S405, the processing of the audio processing unit 104 proceeds to step S406 to be performed by the gain control unit 205.

In step S406, the gain control unit 205 determines whether the input audio level detected by the level detection unit 204 exceeds a threshold level for determining whether to perform the limit operation. When the gain control unit 205 determines that the input audio level is equal to or lower than the threshold level (i.e., the input audio level does not exceed the threshold level) (NO in step S406), the processing proceeds to step S412. On the other hand, when the gain control unit 205 determines that the input audio level exceeds the threshold level (YES in step S406), i.e., the gain control unit 205 determines to perform the limit operation, the processing proceeds to step S407.

In step S407, the gain control unit 205 calculates a gain suppression amount LIM_LEVEL to be used by the level control unit 203 to suppress the gain of the audio signal at the time of the limit operation. The gain control unit 205 calculates the gain suppression amount LIM_LEVEL, for example, by subtracting the threshold level Thresh of the limit operation from the input audio level LEVEL detected by the level detection unit 204. After step S407, the processing proceeds to step S408.

In step S408, the gain control unit 205 calculates a gain value NOW_GAIN to be supplied to the level control unit 203 at the time of the limit operation, and sets the calculated gain value NOW_GAIN to the level control unit 203. For example, the gain control unit 205 calculates the gain value NOW_GAIN in the limit operation by subtracting the gain suppression amount LIM_LEVEL from a gain value setting GAIN when the limit operation is not in progress. After step S408, the processing proceeds to step S409.

In step S409, the gain control unit 205 sets a noise signal attenuation amount NoiseATT of the attenuation by the attenuation unit 208 to zero (0). In this way, in the combination unit 209, the noise signal from the filter 207 is combined with the audio signal from the level control unit 203, without the noise signal level being attenuated. In step S410, the gain control unit 205 adds a predetermined time (for example, the time period of the 1-cycle period) to the limit operation continuation time t. After step S410, processing in step S411 is performed by the control unit 111.

In step S411, the control unit 111 determines whether a recording stop instruction is issued by the user via the operation unit 112. When the control unit 111 determines that the recording stop instruction is not issued (NO in step S411), the processing returns to step S402. In step S402, the control unit 111 continues the processing in the following cycle. In this way, the processing in steps S402 to S411 is performed in each 1-cycle period. The control unit 111 acquires the continuation time t to be compared with the threshold time T in step S402 by adding the predetermined time to the continuation time t in each 1-cycle period in step S410. On the other hand, when the control unit 111 determines that the recording stop instruction is issued (YES in step S411), the control unit 111 transmits a control signal for stopping the audio signal processing to the audio processing unit 104. Then, the processing of the flowchart illustrated in FIG. 3 ends.

When the control unit 111 determines that the input audio level is equal to or lower than the threshold level (NO in step S406) and the processing proceeds to step S412, the gain control unit 205 determines whether the recovery operation after the limit operation is in progress. According to the present exemplary embodiment, after the limit operation is performed because of an input of the audio level exceeding the threshold level, when the input audio level is equal to or lower than the threshold level, the gain control unit 205 performs the recovery operation for increasing the gain to be applied to the level control unit 203 to prevent audio level fluctuations. Therefore, in step S412, the gain control unit 205 determines whether the recovery operation after the limit operation is in progress. More specifically, when the gain suppression amount LIM_LEVEL is larger than zero (0) (LIM_LEVEL>0) and the gain control unit 205 determines that the recovery operation is in progress (YES in step S412), the processing proceeds to step S413. On the other hand, when the gain suppression amount LIM_LEVEL is zero (LIM_LEVEL=0) and the gain control unit 205 determines that the recovery operation is not in progress (NO in step S412), the processing proceeds to step S420.

When the gain control unit 205 determines that the recovery operation is in progress (YES in step S412) and the processing proceeds to step S413, the gain control unit 205 determines whether the current recovery mode is the fast recovery mode. When the gain control unit 205 determines that the current recovery mode is the fast recovery mode (YES in step S413), the processing proceeds to step S414. On the other hand, when the gain control unit 205 determines that the current recovery mode is not the fast recovery mode (i.e., the slow recovery mode) (NO in step S413), the processing proceeds to step S416.

When the gain control unit 205 determines that the current recovery mode is the fast recovery mode (YES in step S413) and the processing proceeds to step S414, the gain control unit 205 sets FAST_RECOV_STEP as a gain recovery amount RECOV_STEP at the time of the recovery operation. The recovery amount FAST_RECOV_STEP refers to a first gain to which the gain is to be increased in the 1-cycle period in the fast recovery mode. Then, in step S415, the gain control unit 205 sets the noise signal attenuation amount NoiseATT by the attenuation unit 208 to zero (0). As a result, the combination unit 209 combines the audio signal from the level control unit 203 with the noise signal from the filter 207 without the noise signal level being attenuated. After step S415, the processing proceeds to step S418.

On the other hand, when the gain control unit 205 determines that the current recovery mode is the slow recovery mode and the processing proceeds to step S416, the gain control unit 205 sets SLOW_RECOV_STEP as the gain recovery amount RECOV_STEP at the time of the recovery operation. The recovery amount SLOW_RECOV_STEP is a second gain to which the gain is to be increased in the 1-cycle period in the slow recovery mode (SLOW_RECOV_STEP<FAST_RECOV_STEP). Then, in step S417, the gain control unit 205 sets the noise signal attenuation amount NoiseATT by the attenuation unit 208 to the gain suppression amount LIM_LEVEL. As a result, the combination unit 209 combines the audio signal from the level control unit 203 with the noise signal from the filter 207, with the noise signal level being attenuated according to the gain suppression amount LIM_LEVEL. After step S417, the processing proceeds to step S418.

In step S418, the gain control unit 205 subtracts the recovery amount RECOV_STEP set in step S414 or S416 from the current gain suppression amount LIM_LEVEL and resets the resultant value to the level control unit 203 as the gain suppression amount LIM_LEVEL. In step S419, the gain control unit 205 keeps the limit operation continuation time t as it is. After step S419, the processing proceeds to step S411 to be performed by the control unit 111.

When the gain control unit 205 determines that the recovery operation is not in progress (NO in step S412) and the processing proceeds to step S420, the gain control unit 205 initializes the limit operation continuation time t to zero (0). After step S402, the processing proceeds to step S411 to be performed by the control unit 111.

As described above, when the input audio signal acquired by the audio input unit 103 is an audio signal with a short limit operation continuation time, such as a single sound, the audio processing unit 104 according to the present exemplary embodiment performs audio processing in the fast recovery mode in which the gain is quickly increased. In the fast recovery mode, the combination unit 209 combines the audio signal from the level control unit 203 with a noise signal similar to the floor noise included in the audio acquired by the microphone 201, without the noise signal being attenuated. Accordingly, the noise signal included in the audio after the combination has a fixed magnitude regardless of the gain processing by the level control unit 203. Therefore, even when the fast recovery operation is performed in a situation where clapping sound continues in a quiet environment, for example, the magnitude of the floor noise component included in the audio signal can be kept constant. Therefore, according to the present exemplary embodiment, it is possible to acquire sound that rarely causes a feeling of strangeness by restricting noise fluctuations even if the input audio level changes in a short time period.

If the input audio signal acquired by the audio input unit 103 is not a single sound but an audio signal with a long limit operation continuation time, the audio processing unit 104 according to the present exemplary embodiment performs the slow recovery mode in which the gain is slowly and gradually increased. In the slow recovery mode, the audio processing unit 104 slowly increases a noise signal similar to the floor noise included in the audio acquired by the microphone 201 based on the gain during the recovery operation, and the combination unit 209 combines the audio signal from the level control unit 203 with the noise signal. Therefore, according to the present exemplary embodiment, the noise component does not solely and suddenly increase in a situation where the gain slowly increases in the slow recovery mode, making it possible to acquire sound that rarely causes a feeling of strangeness.

Figure 4:
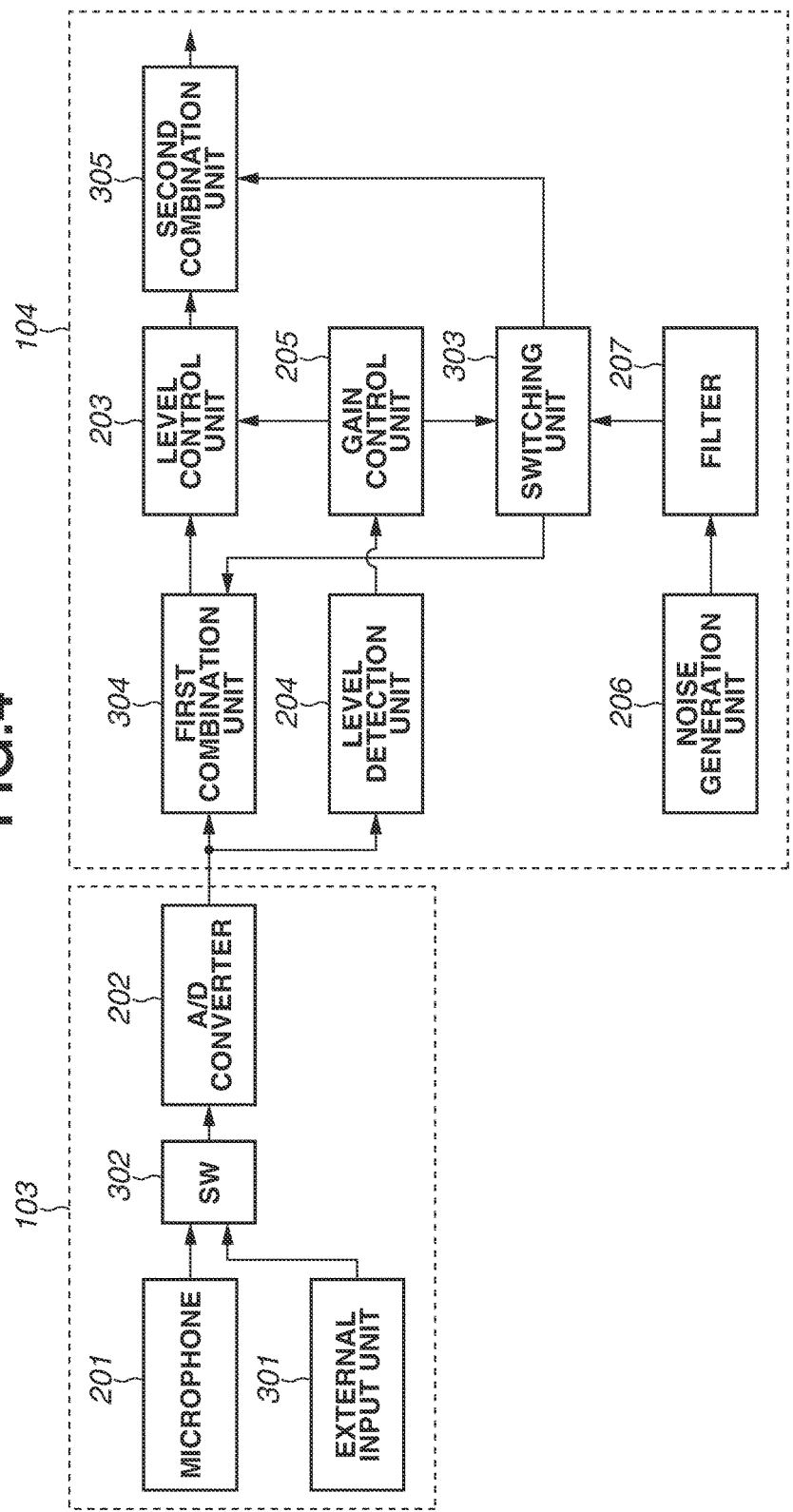
FIG. 4 is a block diagram illustrating configurations of an audio processing unit and an audio input unit according to one or more aspects of the present disclosure.

A configuration and processing of the audio processing unit 104 according to a second exemplary embodiment will be described below. FIG. 4 is a block diagram illustrating an example configuration of the second exemplary embodiment, more specifically, configurations of the audio input unit 103 and the audio processing unit 104 illustrated in FIG. 1. The configuration of the audio processing unit 104 will be described below centering on components for processing an input audio signal from the audio input unit 103. Referring to FIG. 4, components similar to those illustrated in FIG. 2 are assigned the same reference numerals, and detailed descriptions thereof will be omitted.

According to the second exemplary embodiment, as illustrated in FIG. 4, the audio input unit 103 includes an external input unit 301 and a switch 302 in addition to the microphone 201 and the A/D converter 202. When an external microphone is connected, the external input unit 301 acquires an audio signal from the external microphone. The switch 302 selects and outputs either one of an audio signal from the microphone 201 and an audio signal from the external input unit 301. According to the second exemplary embodiment, when an audio input selection instruction is issued by the user via the operation unit 112, the control unit 111 performs switching control on the switch 302 according to the audio input selection instruction. In this way, in the imaging apparatus 100 according to the second exemplary embodiment, the user can select either one of the audio signal from the microphone 201 and the audio signal from the external input unit 301, and store the selected audio signal. The audio signal selected with the switch 302 is transmitted to the A/D converter 202.

The audio processing unit 104 according to the second exemplary embodiment includes a first combination unit 304, a switching unit 303, and a second combination unit 305 in addition to the level detection unit 204, the level control unit 203, the gain control unit 205, the noise generation unit 206, and the filter 207. According to the second exemplary embodiment, the attenuation unit 208 illustrated in FIG. 2 is not provided. The input audio signal output from the audio input unit 103 is input to the level detection unit 204 and the first combination unit 304 of the audio processing unit 104.

In the audio processing unit 104 according to the second exemplary embodiment, the noise signal output from the filter 207 is input to the switching unit 303. According to the second exemplary embodiment, the gain control unit 205 transmits a change instruction to the switching unit 303 based on the audio level detected by the level detection unit 204.

In response to the instruction from the gain control unit 205, the switching unit 303 outputs the noise signal from the filter 207 to either one of the first combination unit 304 and the second combination unit 305. When the noise signal output from the switching unit 303 is transmitted to the first combination unit 304, the first combination unit 304 combines the audio signal from the A/D converter 202 with the noise signal and outputs the combined signal to the level control unit 203. When the first combination unit 304 performs processing for combining the audio signal from the A/D converter 202 with the noise signal, the second combination unit 305 outputs the signal output from the level control unit 203 as it is as an audio signal processed by the audio processing unit 104. When the noise signal output from the switching unit 303 is transmitted to the second combination unit 305, the second combination unit 305 combines the audio signal from the level control unit 203 with the noise signal, and outputs the combined signal. When the second combination unit 305 performs processing for combining the audio signal from the level control unit 203 with the noise signal, the first combination unit 304 outputs the signal output from the A/D converter 202 as it is to the level control unit 203. In this case, the audio signal from the level control unit 203 combined with the noise signal by the second combination unit 305 is output as an audio signal processed by the audio processing unit 104.

Processing of the audio processing unit 104 according to the second exemplary embodiment will be described in detail below.

Figure 5:
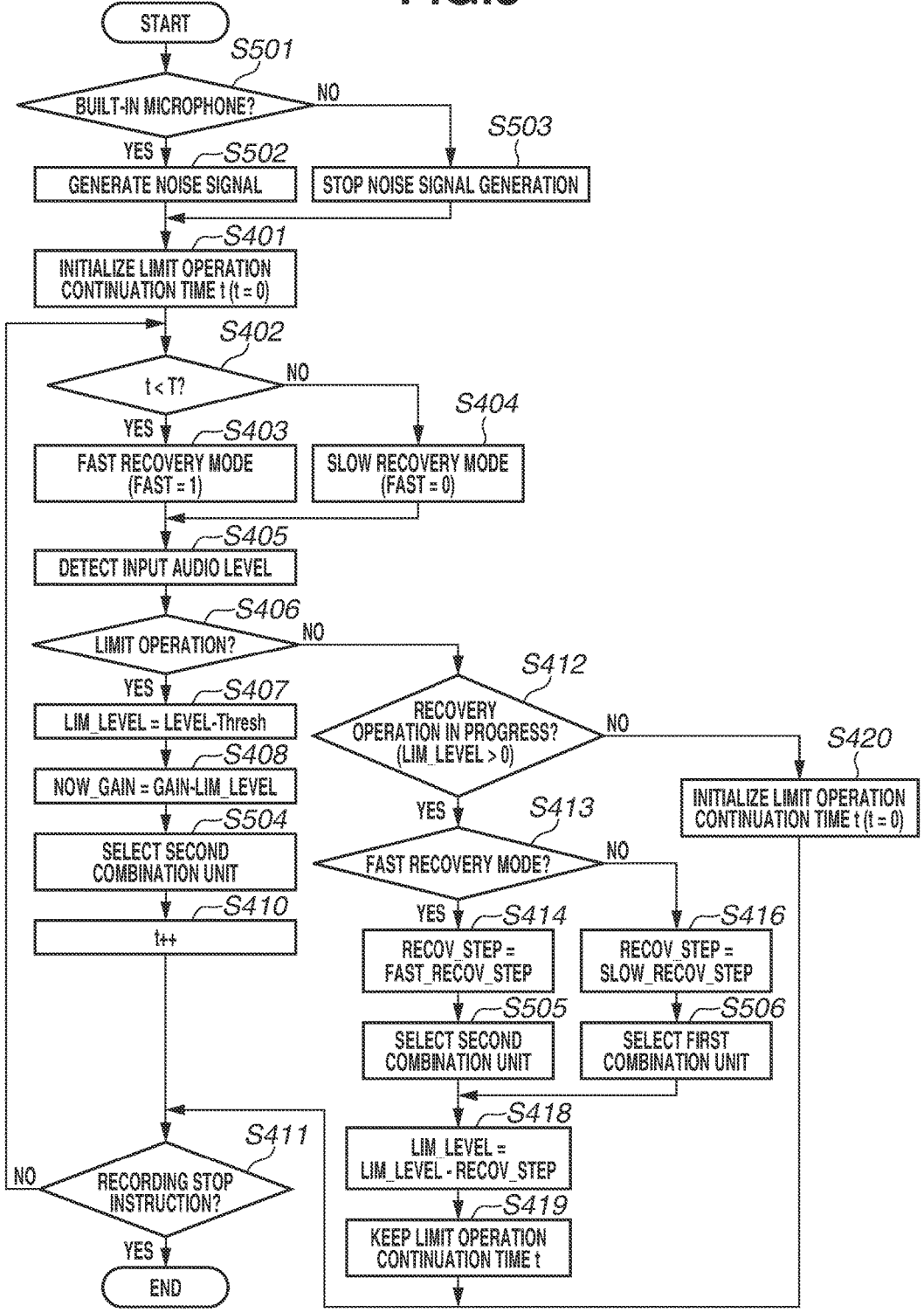
FIG. 5 is a flowchart illustrating audio processing according to one or more aspects of the present disclosure.

FIG. 5 is a flowchart illustrating processing to be performed by the audio processing unit 104 according to the second exemplary embodiment illustrated in FIG. 4. In the flowchart illustrated in FIG. 5, steps S501 and S411 are performed by the control unit 111, and steps S502 and S503 are performed by the noise generation unit 206 under control of the control unit 111. In the flowchart illustrated in FIG. 5, components similar to those illustrated in FIG. 3 are assigned the same reference numerals, and detailed descriptions thereof will be omitted. In the flowchart illustrated in FIG. 5, the processing in steps S401 to S408, S410 to S414, S416, and S418 to S420 is similar to the corresponding processing illustrated in FIG. 3, and redundant descriptions thereof will be omitted. Processing different from the processing of the flowchart illustrated in FIG. 3 will be described below.

Similar to the first exemplary embodiment, processing of the flowchart according to the second exemplary embodiment illustrated in FIG. 5 is started when a moving image capturing/recording start instruction is input from the operation unit 112, and a recording start control signal is input from the control unit 111 to the audio processing unit 104. The 1-cycle processing in steps S402 to S411 is repetitively performed until a moving image recording stop instruction is input from the operation unit 112.

When the processing of the flowchart illustrated in FIG. 5 is started, then in step S501, the control unit 111 determines whether the user selects the audio signal from the microphone 201 based on a selection instruction via the operation unit 112. When the control unit 111 determines that the user selects the audio signal from the microphone 201 (YES in step S501), the control unit 111 performs switching on the switch 302 so that the audio signal is output from the microphone 201. Then, the processing proceeds to step S502 to be performed by the noise generation unit 206. On the other hand, when the control unit 111 determines that the user does not select the audio signal from the microphone 201 (NO in step S501), the control unit 111 performs switching on the switch 302 so that the audio signal is output from the external input unit 301. Then, the processing proceeds to step S503 to be performed by the noise generation unit 206.

In step S502, the control unit 111 controls the noise generation unit 206 to generate a noise signal. In step S503, the control unit 111 controls the noise generation unit 206 not to generate a noise signal. Since the microphone 201 is a built-in microphone, the frequency characteristics of the floor noise included in the audio signal of the microphone 201 can be known in advance. Therefore, when the microphone 201 is selected, the audio processing unit 104 generates a noise signal corresponding to the pre-acquired frequency characteristics of the microphone 201 by processing the noise signal generated by the noise generation unit 206, via the filter 207. On the other hand, the frequency characteristics of the floor noise included in the audio signal from the external microphone connected to the external input unit 301 cannot be known in advance. Therefore, according to the present exemplary embodiment, when the external input unit 301 is selected, the audio processing unit 104 controls the noise generation unit 206 not to generate a noise signal. After steps S502 and S503, the processing proceeds to step S401.

According to the second exemplary embodiment, when the gain control unit 205 determines to perform the limit operation (YES in step S406) and performs processing in steps S407 and S408, the processing proceeds to step S504. In step S504, the gain control unit 205 controls the switching unit 303 to output the noise signal generated by the noise generation unit 206 and processed by the filter 207 to the second combination unit 305. In this way, during execution of the limit operation with the microphone 201 being selected, the second combination unit 305 combines the audio signal from the level control unit 203 with the noise signal. After the processing in step S504, the processing proceeds to step S410.

When the gain control unit 205 determines that the recovery operation is in progress (YES in step S412), determines that the current recovery mode is the fast recovery mode (YES in step S413), and performs the processing in step S414, the processing proceeds to step S505. In step S505, the gain control unit 205 controls the switching unit 303 to output the noise signal generated by the noise generation unit 206 and processed by the filter 207 to the second combination unit 305. In this way, during execution of the limit operation in the fast recovery mode with the microphone 201 being selected, the second combination unit 305 combines the audio signal from the level control unit 203 with the noise signal. After step S505, the processing proceeds to step S418.

When the gain control unit 205 determines that the recovery operation is in progress in the slow recovery mode (NO in step S413) and performs the processing in step S416, the processing proceeds to step S506. In step S506, the gain control unit 205 controls the switching unit 303 to output the noise signal generated by the noise generation unit 206 and processed by the filter 207 to the first combination unit 304. In this way, during execution of the recovery operation in the slow recovery mode with the microphone 201 being selected, the first combination unit 304 combines the audio signal from the A/D converter 202 with the noise signal. After step S506, the processing proceeds to step S418.

As described above, when the input audio signal acquired by the audio input unit 103 is an audio signal with a short limit operation continuation time, such as a single sound, the audio processing unit 104 according to the present exemplary embodiment performs audio processing in the fast recovery mode in which the gain is quickly increased. Meanwhile, in the audio processing unit 104, the second combination unit 305 combines the audio signal output from the level control unit 203 with a noise signal similar to the floor noise included in the audio acquired by the microphone 201. Accordingly, the noise signal included in the combined audio has a fixed magnitude regardless of the gain processing by the level control unit 203. Therefore, even when the fast recovery operation is performed, for example, in a situation where clapping sound continues in a quiet environment, the magnitude of the floor noise component included in the audio signal can be kept constant. Therefore, according to the second exemplary embodiment, it is possible to acquire sound that rarely causes a feeling of strangeness by restricting noise fluctuations even if the input audio level changes in a short time period.

If the input audio signal acquired by the audio input unit 103 is an audio signal with a long limit operation continuation time, the audio processing unit 104 according to the second exemplary embodiment performs the slow recovery mode in which the gain is slowly increased. Meanwhile, in the audio processing unit 104, the first combination unit 304 combines the audio signal output from the A/D converter 202 with a noise signal similar to the floor noise included in the audio acquired by the microphone 201, and outputs the combined signal to the level control unit 203. Therefore, according to the present exemplary embodiment, in a situation where the gain slowly increases in the slow recovery mode, the noise component does not solely and suddenly increase, making it possible to acquire sound that rarely causes a feeling of strangeness.

According to the second exemplary embodiment, in a case where an external microphone is connected to the external input unit 301, if the frequency components of the noise signal included in the audio signal of the external microphone cannot be acquired, the noise generation unit 206 does not generate a noise signal. This prevents a noise signal having different frequency components from the noise signal included in the audio signal of the external microphone from being combined with the audio signal. When the frequency components of the noise signal included in the audio signal of the external microphone connected to the external input unit 301 can be acquired, the noise generation unit 206 may generate a noise signal and output the noise signal to the filter 207. In this case, the filter 207 performs filter processing on the noise signal generated by the noise generation unit 206 in accordance with the frequency components of the noise signal included in the audio signal from the external microphone, and outputs the noise signal on which the filter processing has been performed.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, the scope of the following claims are to be accorded the broadest interpretation so as to encompass all such modifications and equivalent structures and functions.

This application claims the benefit of Japanese Patent Application No. 2017-099659, filed May 19, 2017, which is hereby incorporated by reference herein in its entirety.

What is claimed is:

1. An audio processing apparatus comprising:
a detection unit configured to detect a level of an input audio signal;
a level control unit configured to control the level of the audio signal according to a gain;
a gain control unit configured to,
in a case where the detected level exceeds a threshold level, perform a limit operation for decreasing the gain so that the level of the audio signal to be output from the level control unit becomes equal to or lower than the threshold level, and
in a case where the level becomes not higher than the threshold level during execution of the limit operation, perform a recovery operation for increasing the gain;
a noise generation unit configured to output a noise signal; and
a combination unit configured to combine the audio signal output from the level control unit with the noise signal output from the noise generation unit,
wherein the gain control unit includes a first recovery mode and a second recovery mode as the recovery operation,
wherein, in the second recovery mode, the gain control unit increases the gain in a longer time than in the first recovery mode, and
wherein the gain control unit controls the noise generation unit,
in the first recovery mode, to output the noise signal with a predetermined level, and
in the second recovery mode, to output the noise signal with a level according to the gain of the level control unit.

2. The audio processing apparatus according to claim 1, wherein the gain control unit controls the noise generation unit to output the noise signal with the predetermined level during execution of the limit operation.

3. The audio processing apparatus according to claim 1, wherein the noise generation unit includes:
a generation unit configured to generate the noise signal;
a filter configured to process the noise signal generated by the generation unit so that the noise signal has frequency characteristics of the noise included in the input audio signal; and
an attenuation unit configured to attenuate the noise signal from the filter, and output the noise signal, and
wherein the gain control unit controls the attenuation unit,
in the first recovery mode, to output the noise signal without attenuating the noise signal, and
in the second recovery mode, to attenuate the noise signal according to the gain of the level control unit and output the attenuated noise signal.

4. The audio processing apparatus according to claim 1, wherein the gain control unit,
in a case where a limit operation continuation time is not equal to or longer than a threshold time, sets the first recovery mode, and
in a case where a last limit operation continuation time is equal to or longer than the threshold time, sets the second recovery mode.

5. The audio processing apparatus according to claim 4, wherein the gain control unit determines whether the detected level exceeds the threshold level in each predetermined 1-cycle period, and, in a case where the detected level continuously exceeds the threshold level, the gain control unit adds a predetermined time to acquire the limit operation continuation time.

6. The audio processing apparatus according to claim 1, wherein the gain control unit,
in a case where the first recovery mode is set, sets the gain to be increased in each predetermined 1-cycle period in the recovery operation to a first gain, and
in a case where the second recovery mode is set, sets the gain to be increased in each predetermined 1-cycle period in the recovery operation to a second gain lower than the first gain.

7. The audio processing apparatus according to claim 6, wherein, after the level becomes equal to or lower than the threshold level during execution of the limit operation, in a case where a level obtained by subtracting the threshold level from the detected level is larger than zero, the gain control unit determines that the recovery operation is in progress.

8. The audio processing apparatus according to claim 7, wherein, when the level obtained by subtracting the threshold level from the detected level becomes zero during execution of the recovery operation, the gain control unit determines that the recovery operation has ended.

9. An audio processing apparatus comprising:
a detection unit configured to detect a level of an input audio signal;
a noise generation unit configured to output a noise signal;

a first combination unit configured to combine the input audio signal with the noise signal in a case where the noise signal output from the noise generation unit is supplied;

a level control unit configured to control the level of the audio signal output from the first combination unit according to the gain;

a second combination unit configured to combine the audio signal output from the level control unit with the noise signal in a case where the noise signal output from the noise generation unit is supplied; and a gain control unit configured to, in a case where the detected level exceeds a threshold level, perform a limit operation for decreasing the gain so that the level of the audio signal to be output from the level control unit becomes equal to or lower than the threshold level, and in a case where the level becomes not higher than the threshold level during execution of the limit operation, perform a recovery operation for increasing the gain, wherein the gain control unit includes a first recovery mode and a second recovery mode as the recovery operation, wherein, in the second recovery mode, the gain control unit increases the gain in a longer time than in the first recovery mode, and wherein the gain control unit controls the noise generation unit, in the first recovery mode, to output the noise signal to the second combination unit and not to output the noise signal to the first combination unit, and in the second recovery mode, to output the noise signal to the first combination unit and not to output the noise signal to the second combination unit.

10. The audio processing apparatus according to claim 9, wherein, during execution of the limit operation, the gain control unit controls the noise generation unit to output the noise signal to the second combination unit and not to output the noise signal to the first combination unit.

11. The audio processing apparatus according to claim 9, wherein the noise generation unit includes:

a generation unit configured to generate the noise signal; and a filter configured to process the noise signal generated by the generation unit so that the noise signal has frequency characteristics of the noise included in the input audio signal, and output the noise signal.

12. The audio processing apparatus according to claim 9, wherein the gain control unit, in a case where a limit operation continuation time is not equal to or longer than a threshold time, sets the first recovery mode, and in a case where a last limit operation continuation time is equal to or longer than the threshold time, sets the second recovery mode.

13. The audio processing apparatus according to claim 12, wherein the gain control unit determines whether the detected level exceeds the threshold level in each predetermined 1-cycle period, and, in a case where the detected level continuously exceeds the threshold level, the gain control unit adds a predetermined time to acquire the limit operation continuation time.

14. The audio processing apparatus according to claim 9, wherein the gain control unit, in a case where the first recovery mode is set, sets the gain to be increased in each predetermined 1-cycle period in the recovery operation to a first gain, and in a case where the second recovery mode is set, sets the gain to be increased in each predetermined 1-cycle period in the recovery operation to a second gain lower than the first gain.

15. The audio processing apparatus according to claim 14, wherein, after the level becomes equal to or lower than the threshold level during execution of the limit operation, in a case where a level obtained by subtracting the threshold level from the detected level is larger than zero, the gain control unit determines that the recovery operation is in progress.

16. The audio processing apparatus according to claim 15, wherein, when the level obtained by subtracting the threshold level from the detected level becomes zero during execution of the recovery operation, the gain control unit determines that the recovery operation has ended.

17. An audio processing method for an audio processing apparatus, the audio processing method comprising:

detection for detecting a level of an input audio signal;

level control for controlling the level of the audio signal according to a gain;

gain control for performing, in a case where the detected level exceeds a threshold level, a limit operation for decreasing the gain so that the level of the audio signal to be output by the level control becomes equal to or lower than the threshold level, and in a case where the level becomes not higher than the threshold level during execution of the limit operation, a recovery operation for increasing the gain, noise generation for outputting a noise signal; and combination for combining the audio signal output by the level control with the noise signal output by the noise generation, wherein the gain control includes a first recovery mode and a second recovery mode as the recovery operation, wherein, in the second recovery mode, the gain control increases the gain in a longer time than in the first recovery mode, and wherein the gain control controls the noise generation, in the first recovery mode, to output the noise signal with a predetermined level, and in the second recovery mode, to output the noise signal with a level according to the gain of the level controlling.

18. An audio processing method for an audio processing apparatus, the audio processing method comprising:

detection for detecting a level of an input audio signal;

noise generation for outputting a noise signal;

first combination for combining the input audio signal with the noise signal in a case where the noise signal output by the noise generation is supplied;

level control for controlling a level of the audio signal output by the first combination according to the gain;

second combination for combining the audio signal output by the level control with the noise signal in a case where the noise signal output by the noise generation is supplied; and gain control for performing, in a case where the detected level exceeds a threshold level, a limit operation for decreasing the gain so that the level of the audio signal output by the level control becomes equal to or lower than the threshold level, and in a case where the level becomes not higher than the threshold level during execution of the limit operation, a recovery operation for increasing the gain, wherein the gain control includes a first recovery mode and a second recovery mode as the recovery operation, wherein, in the second recovery mode, the gain control increases the gain in a longer time than in the first recovery mode, and wherein the gain control controls the noise generation, in the first recovery mode, to output the noise signal to the second combination and does not output the noise signal to the first combination, and in the second recovery mode, to output the noise signal to the first combination and does not output the noise signal to the second combination.

\* \* \* \* \*